United States Patent
Watson et al.

(10) Patent No.: US 7,889,588 B2
(45) Date of Patent: Feb. 15, 2011

(54) CIRCUIT HAVING GATE OXIDE PROTECTION FOR LOW VOLTAGE FUSE READS AND HIGH VOLTAGE FUSE PROGRAMMING

(75) Inventors: Calvin Watson, Austin, TX (US); Matthew Cooke, Austin, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 377 days.

(21) Appl. No.: 11/970,782

(22) Filed: Jan. 8, 2008

(65) Prior Publication Data
US 2009/0175111 A1    Jul. 9, 2009

(51) Int. Cl.
*G11C 17/18* (2006.01)
(52) U.S. Cl. ............... 365/225.7; 365/210.1; 365/207
(58) Field of Classification Search ........... 365/225.7, 365/210.1, 207
See application file for complete search history.

(56) References Cited

U.S. PATENT DOCUMENTS

| | | | |
|---|---|---|---|
| 5,418,487 A | | 5/1995 | Armstrong |
| 5,731,733 A * | | 3/1998 | Denham ................ 327/525 |
| 5,731,760 A * | | 3/1998 | Ramirez ................ 340/638 |
| 6,346,845 B1 | | 2/2002 | Choi |
| 6,424,161 B2 * | | 7/2002 | Damon et al. ........... 324/550 |
| 6,498,526 B2 * | | 12/2002 | Lim et al. ............... 327/525 |
| 6,590,825 B2 * | | 7/2003 | Tran et al. .............. 365/225.7 |
| 6,670,843 B1 * | | 12/2003 | Moench et al. .......... 327/525 |
| 6,876,594 B2 * | | 4/2005 | Griesmer et al. ........ 365/225.7 |
| 6,903,598 B2 * | | 6/2005 | Denham et al. .......... 327/525 |
| 6,906,557 B1 | | 6/2005 | Parker et al. |
| 6,919,754 B2 * | | 7/2005 | Kuroki ................... 327/525 |
| 6,995,602 B2 * | | 2/2006 | Pelliconi ................ 327/536 |
| 7,019,534 B2 * | | 3/2006 | Wu ........................ 324/550 |
| 7,050,349 B2 * | | 5/2006 | Tanizaki ................. 365/225.7 |
| 7,098,721 B2 * | | 8/2006 | Ouellette et al. ......... 327/525 |
| 7,119,603 B2 * | | 10/2006 | Newman ................. 327/525 |
| 7,215,175 B1 * | | 5/2007 | Mandal et al. ........... 327/525 |
| 7,307,864 B2 * | | 12/2007 | Kohara ................... 365/96 |
| 7,307,911 B1 * | | 12/2007 | Anand et al. ............ 365/225.7 |
| 7,327,595 B2 * | | 2/2008 | Audy et al. .............. 365/96 |
| 7,403,061 B2 * | | 7/2008 | Barwin et al. ........... 327/525 |
| 7,560,965 B2 * | | 7/2009 | Waldrip et al. .......... 327/202 |
| 7,688,654 B2 * | | 3/2010 | Anand et al. ............ 365/196 |

* cited by examiner

*Primary Examiner*—Viet Q Nguyen
(74) *Attorney, Agent, or Firm*—Meyertons, Hood, Kivlin, Kowert & Goetzel, P.C.; Erik A. Heter

(57) ABSTRACT

A circuit for reading and programming a fuse. The electronic circuit includes a data fuse coupled to a data node and a reference fuse coupled to a reference node. A programming circuit is coupled to the data node, wherein the programming circuit is configured to, when activated, cause the data fuse to be programmed. A sensing circuit is configured to draw current from the data node and the reference node in order to develop a voltage differential between the data node and the reference node during a read operation. A read circuit is configured to, when activated, enable the sensing circuit to develop the voltage differential during the read operation. A protection circuit is configured to form a voltage divider within the sensing circuit during programming of the fuse.

20 Claims, 3 Drawing Sheets

CIRCUIT HAVING GATE OXIDE PROTECTION FOR LOW VOLTAGE FUSE READS AND HIGH VOLTAGE FUSE PROGRAMMING

BACKGROUND OF THE INVENTION

1. Field of the Invention

This invention relates to electronic circuits, and more particularly, to circuits for programming and reading fuses in integrated circuits.

2. Description of the Related Art

Integrated circuits, such as processor, often times use fuses to store configuration information. For example, during the final phases of manufacturing of a processor, various fuses may be programmed to determine the processor configuration. This configuration may vary according to the type of system in which the processor is to be used (e.g., one configuration for a laptop, another configuration for a desktop), which interfaces are to be activated, the frequency of the core clock, and so forth.

During initialization of the integrated circuit, the configuration information is read and used to configure it for operation. More particularly, fuses are read to determine which ones are programmed (i.e. 'blown') and which ones are not programmed (i.e. not 'blown'). The integrated circuit is then configured for operation based on which fuses are programmed and which are not.

In order to program a fuse, a circuit coupled thereto may draw a sufficient amount of current through the fuse in order to cause the fuse to effectively form an open circuit by increasing its resistance significantly. After the fuse has been programmed, another circuit coupled thereto may sense the state of the fuse upon startup of the integrated circuit.

SUMMARY OF THE INVENTION

A circuit for reading and programming a fuse is disclosed. In one embodiment, an electronic circuit includes a data fuse coupled to a data node and a reference fuse coupled to a reference node. A programming circuit is coupled to the data node, wherein the programming circuit is configured to, when activated, cause the data fuse to be programmed. A sensing circuit is configured to draw current from the data node and the reference node in order to develop a voltage differential between the data node and the reference node during a read operation. A read circuit is configured to, when activated, enable the sensing circuit to develop the voltage differential during the read operation. A protection circuit is configured to form a voltage divider within the sensing circuit during programming of the fuse.

A microprocessor including a plurality of fuse circuits, such as those described above is also disclosed. The processor also includes a fuse reader unit configured to, upon processor startup, read information to determine a processor operation configuration.

In one embodiment, the data fuse is coupled between the data node and a positive supply voltage node, while the reference fuse is coupled between the reference node and the positive supply voltage node. The data fuse may be programmed by severing an electrical connection between the positive supply voltage node and the data node. During read operations of a programmed data fuse, a differential voltage (with the voltage on the data node being greater than the voltage on the reference node) will be developed between the reference node and the data node during read operations. The voltages of the reference node and the data node are provided as input signals to a comparator, which then determines whether or not the data fuse is programmed.

BRIEF DESCRIPTION OF THE DRAWINGS

Other aspects of the invention will become apparent upon reading the following detailed description and upon reference to the accompanying drawings in which.

Figure 1:
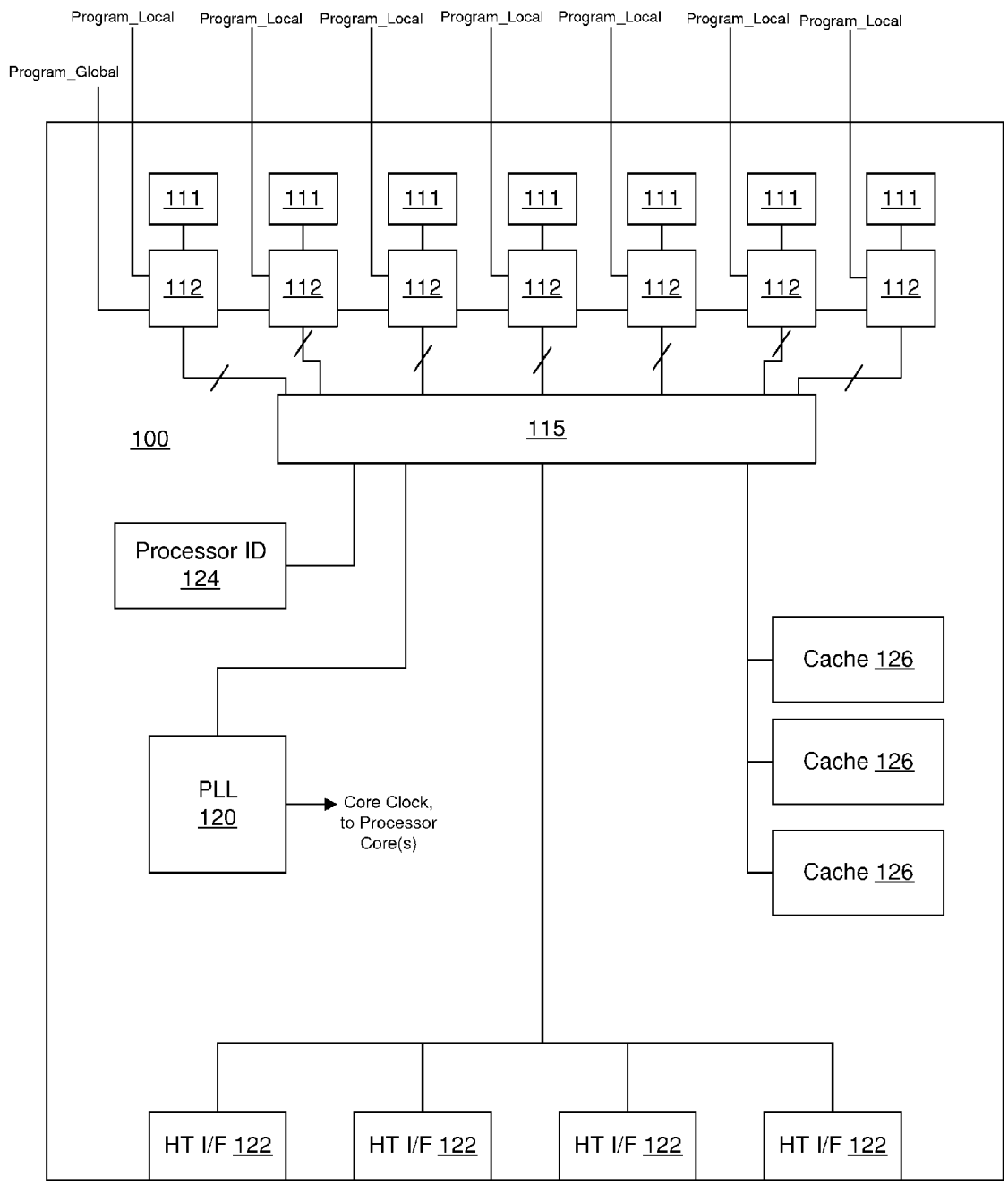
FIG. 1 is a drawing of a processor having a plurality of programming fuses.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a drawing of a processor having a plurality of programming fuses is shown. In the embodiment shown, processor 100 includes a plurality of fuse units 111, each of which is coupled to a corresponding fuse programming/sensing circuit 112. Each fuse unit may include two different fuses, a data fuse (which may be programmed), and a reference fuse (which is not intended to be programmed). Prior to shipping the processor, a manufacturer thereof may program some or all of the fuses, depending on the desired configuration of the processor. Programming may be performed by the programming/sensing circuits 112, which may perform the programming by severing an electrical connection (i.e. 'blowing') of the fuse(s) to be programmed. In the embodiment shown, programming is accomplished through a plurality of external inputs. A single global programming (program_global) signal is provided to each of the programming/sensing circuits 112 during programming operations. Local programming signals (program_local) are selectively provided to certain ones of the programming/sensing circuits 112 that are associated with fuses to be programmed. It should be noted that the external pin connections for programming are exemplary, and that other means of programming various ones of the fuses of fuse units 111 are also possible and contemplated.

After processor 100 has been placed within a computer system, its intended operating condition may be determined upon system startup. More particularly, fuse reading unit 115 may determine which ones of the plurality of fuse units 111 include a programmed data fuse. Fuse reading unit 115 may then enable which functions onboard the processor may be enabled or disabled, based on which fuses are programmed and which fuses are not programmed. Fuse reading unit 115 is coupled to each of the plurality of programming/sensing circuits 112 by a plurality of signal paths. These signal paths include a read signal (i.e. command to read) that it provided to each of the programming/sensing circuits 112 in order to cause a read. Also included in the plurality of signal paths are one or more paths for conveying data (e.g., fuse data and reference data) back to fuse reading circuit 115. Thus, these signal paths provide a communications link for reading the state of the fuses to determine which ones are programmed.

In the embodiment shown, processor 100 includes a processor ID unit 124, a PLL 120, a plurality of caches 126, and a plurality of HyperTransport interfaces 122. The programming of fuses in the fuse units 111 may determine which of these functional blocks is enabled during operation, or how they are otherwise configured.

A processor ID may be determined based on the programming of various ones of the data fuses. This processor ID may be written to the processor ID unit 124, for subsequent access should the processor ID be needed.

One or more clock frequencies at which a core of processor 100 may operate may be determined by the programming of various fuses. Based on the programming, fuse reading unit 115 may provide information to phase locked loop (PLL) 120 that determines the frequencies of the core clock signal. PLL 120 may include clock divider and/or clock multiplier circuitry that can enable it to provide an output clock signal that is fraction or a multiple of a reference clock. Thus, PLL 120 may be enabled to provide a core clock signal at a number of different frequencies. These frequencies may be determined based on the programming of the fuses, as well as the current operating state. For example, if processor 110 is intended for use in a laptop computer system, fuses may be programmed to enable a first set of core clock frequencies in according to various requirements of the system (e.g., power requirements, thermal requirements). If processor 110 is intended instead for a high power desktop system, PLL 120 may be configured, based on the programming, to provide a second set of frequencies.

Processor 100 also includes a plurality of cache memories 126. These cache memories may provide different cache levels. Based on the programming of various ones of the fuses, one or more of cache memories may be enabled. For example, if processor 100 is intended for a computer system having low or moderate performance specifications, a single one of cache memories 126 may be enabled. In another example, if processor 100 is intended for a high performance computer system, all three of cache memories 126 may be enabled.

Similar to the above examples, one or more of the HyperTransport interfaces may be enabled by the programming of the fuses according to the operating requirements of the computer system for which processor 100 is intended.

It should be noted that processor 100 is exemplary. Other processors are possible and contemplated, and the general principles discussed herein may be applied to any type of processor in which fuses are programmed in order to effect a particular configuration. Furthermore, the principles discussed herein may be applied to integrated circuits other than processors in which fuse programming is used to set a particular operating configuration.

Figure 2:
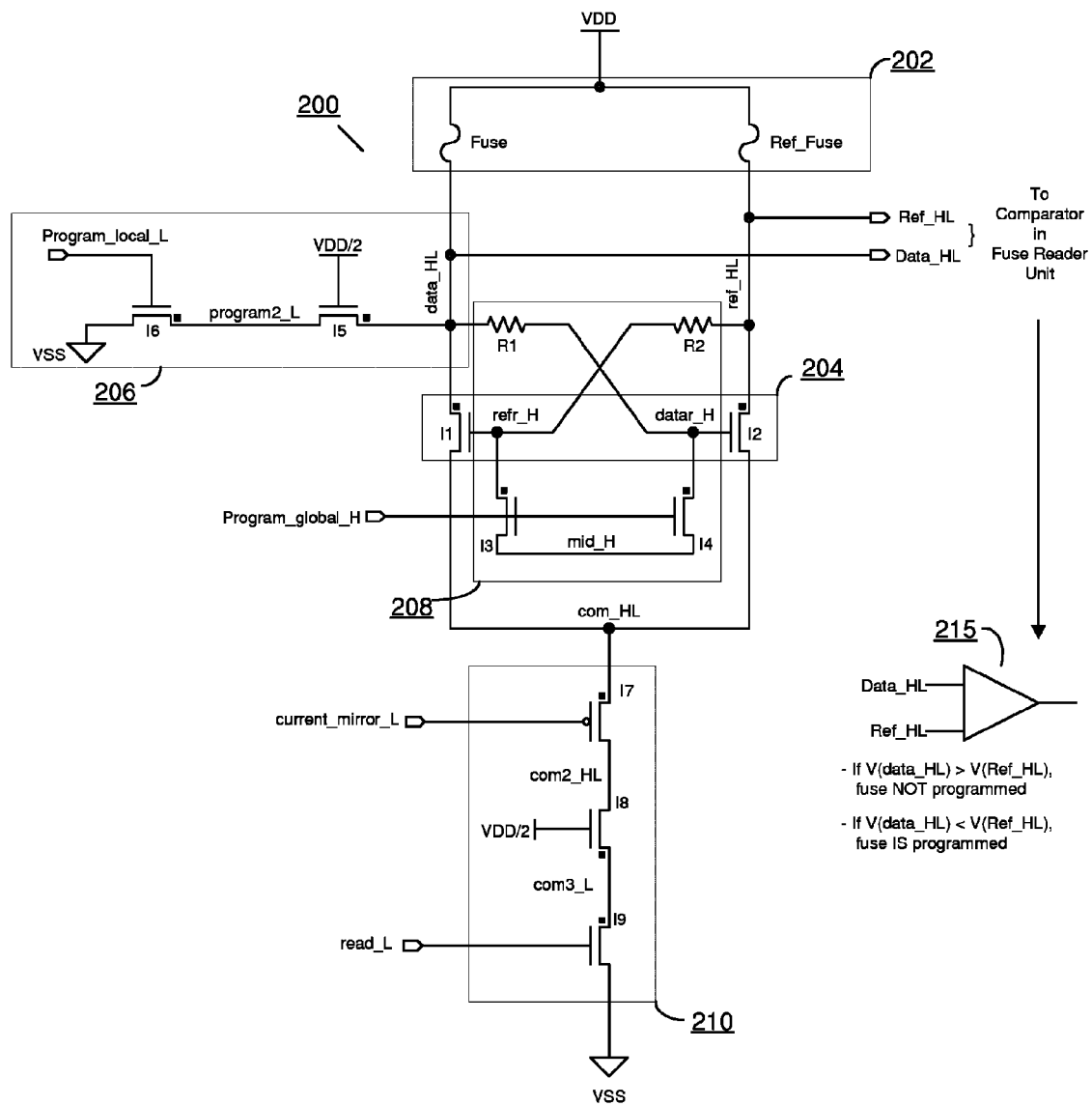
FIG. 2 is a schematic diagram of one embodiment of a fuse programming/sensing circuit.

Moving now to FIG. 2, a schematic diagram of one embodiment of a fuse programming/sensing circuit is shown. Electronic circuit 200 as shown in this embodiment may be used to implement both the fuses as well as the circuits necessary for programming and reading the fuses, in accordance with the fuse units 111 and fuse programming/sensing circuits 112 as shown in FIG. 1.

In the embodiment shown, fuse pair 202 includes a data fuse ('Fuse') and a reference fuse ('Ref_Fuse'). The fuse pair may correspond to the fuses within fuse unit 11 of FIG. 1. The data fuse may be programmed, depending on the desired configuration of the device in which it is implemented. The reference fuse is not intended to be programmed.

Both the data fuse and the reference fuse have relatively low resistance. However, when the data fuse is not programmed, the reference fuse resistance is typically at least 5 times that of the data fuse, and in many embodiments, is at least one order of magnitude greater (i.e. >10×). When the data fuse is programmed, the electrically conductive path it provides is effectively severed (i.e. the fuse is 'blown'). Ideally, when the data fuse is programmed, it will be an open circuit. In practice, the electrical path is not completely severed, and a very small amount of current will flow through the path. However, when programmed, the remaining electrical path through the data fuse is very high resistance, typically at least one or more orders of magnitude greater than that of the reference fuse (and at minimum, five times greater). These different resistances through the respective electrical paths defined by the locations of the data fuse and reference fuse enable the development of voltage differential between the data node (data_HL) and the reference node (Ref_HL), as will be discussed in further detail below.

Electronic circuit 200 also includes various circuits for programming the fuse, initiating a read of the fuse, sensing the state of the fuse, and protecting the sensing circuit during reads. In the embodiment shown, electronic circuit 200 includes sensing circuit 204, programming circuit 206, protection circuit 208, and read circuit 210. The functioning of each of these circuits will now be explained in more detail. It should be noted that, for clarity in the schematic diagram shown, the drain terminals of each of the transistors are indicated by a square black dot. With respect to the designation of various nodes (e.g., data_HL, program_local_L, etc.), the 'H', 'L', or 'HL' refers to its respective voltage domain, with 'H' indicating a high voltage domain, 'L' indicating a low voltage domain, and 'HL' indicating an intermediate voltage domain. Finally, for the sake of simplicity, VDD=2 volts, VSS=0 volts, and VDD/2=1 volt for the discussion herein, although it is understood that these voltages are exemplary and thus not limiting. Other embodiments using different voltages as well as transistors rated for different voltage swings between their respective terminals are also possible and contemplated.

In the embodiment shown, electronic circuit 200 is implemented using various MOS (metal oxide semiconductor) transistors, with the circuit including NMOS (N-channel MOS) devices and one PMOS (P-channel MOS) device. Other embodiments using different combinations of NMOS and PMOS devices are also possible and contemplated, as well as embodiments using only a single type (e.g., NMOS only). While it is noted above that the voltage difference between VDD and VSS is 2 volts (i.e. VDD=2 volts and VSS=0 volts), the devices used in the circuit shown herein are not rated for such voltage swings. For example, a gate-source or a gate-drain voltage difference of 2 volts on a given transistor used in the embodiment shown will stress its gate oxide to a point where it is damaged and may become inoperable. Typically, the transistors used in the embodiment shown are rated for gate-source and gate-drain voltage values of that are greater than 1 volt in magnitude, but significantly less than 2 volts in magnitude. Thus, the circuit shown herein is designed with protection of the gate oxides of the transistors in mind, allowing the use of smaller devices that are not rated for voltage differences of the magnitude of VDD–VSS. This enables the use of smaller devices that may otherwise not be suitable for such an application. The circuit is further designed to operate without the use of a level shifter, in order to save area, while also providing a mechanism for reliable reads.

Programming circuit 206 is configured to perform programming of the data fuse. The gate terminal of transistor I6 is coupled to a local programming node, and thus is coupled to receive a local programming signal. The data fuse may be programmed by asserting the local programming signal on the gate terminal of transistor I6 having a voltage sufficient to activate the device. Since the gate terminal of transistor I5 is coupled to an intermediate supply voltage, VDD/2, activating transistor I6 will in turn cause the gate-source voltage of I5 to exceed its threshold voltage ($V_{th}$), thereby activating it as well. When both transistors I5 and I6 are activated, a current path exists between a data node, data_HL, and VSS. If VSS is 0 volts, then the activation of transistors I5 and I6 pulls the voltage of data_HL down to nearly 0 volts. When the voltage on data_HL is near 0 volts, a voltage difference of nearly 2 volts exists between the data node and VDD in this example. This in turn causes a significant amount of current to flow through the data fuse until it is effectively severed, or 'blown'. Thus, programming is accomplished by blowing the data fuse.

Protection circuit 208 includes two transistors, I3 and I4, along with resistors R1 and R2. The gate terminals of transistors I3 and I4 are each coupled to a global programming node, and are thus coupled to receive a the signal program_global_H. During programming, the program_global_H signal is asserted on the gate terminals of these transistors. As the name implies, this signal is a global signal, and may be provided to each instance of a fuse programming/sensing circuit during programming, even those associated with fuses that are not intended to be programmed. Activation of transistors I3 and I4 result in the creation of a temporary voltage divider within sensing circuit 204, which results in the protection of the gate oxide of its transistors, as will be discussed below. Resistors R1 and R2 have approximately equal resistance values in the embodiment shown, and thus the node mid_H will be at a voltage approximately halfway between VDD and VSS when I3 and I4 are active.

Read circuit 210 includes transistors I7, I8, and I9. The drain terminal of transistor I7 is coupled to a common node, which is, more particularly, common to the source terminals of both transistors I1 and I2. The gate terminal of transistor I7 is coupled to a current mirror node, and is thus coupled to receive a current_mirror_L signal. The current_mirror_L signal may be formed by a current mirror including transistor I7 and a diode-coupled transistor (not shown here) having its gate terminal coupled to the gate terminal of I7. Thus, transistor I7 may mirror the current through the diode-coupled transistor. Since I7 is a PMOS transistor in this embodiment, the diode-coupled transistor with which it forms a current mirror may also be a PMOS transistor. By coupling I7 to another transistor in a current mirror configuration, the current through the read circuit can be controlled to prevent it from becoming excessive. This feature may be useful if the VDD supply voltage is unknown.

Transistor I8 is coupled in a cascode configuration with transistor I7, its source node being coupled to that of I7, while its drain is coupled to intermediate supply voltage VDD/2. Transistor I8 provides protection for the gate oxide of transistor I9 by preventing the voltage on node com3_L from rising above $VDD/2-V_{TH}$, where $V_{TH}$ is the threshold voltage of I9 when not reading or programming. Transistor I7 provides protection of the gate oxide of transistors I1 and I2 (of sensing circuit 204) by preventing the voltage of the common node, com_HL, from falling below a voltage of v(current_mirror_L)+$V_{TH}$ during reads.

During reads, a read_L signal is asserted on the gate terminal of transistor I9 (which is coupled to a read node), thereby causing its activation. When transistor I9 is activated, node com3_L is pulled down to near VSS. This in turn results in transistor I8 being activated, pulling down node com2_HL to near VSS as well. Node com_HL is pulled to a voltage of v(current_mirror_L)+$V_{TH}$, thereby drawing current that is driven from nodes data_HL and ref_HL by transistors I1 and I2, respectively.

Sensing circuit 204 includes transistors I1 and I2. The drain terminal of transistor I1 is coupled to the data node, data_HL, while the drain terminal of transistor I2 is coupled to the reference node, ref_HL. The source terminals of both I1 and I2 are coupled to the common node, com_HL. Resistor R1 is coupled between the data node and the gate terminal of transistor I2 (at node datar_H). Resistor R2 is coupled between the reference node and the gate terminal of transistor I1 (at node refr_H).

The transistors of programming circuit 206 and protection circuit 208 are deactivated (i.e. turned off) during reads. The gate terminals of transistors I1 and I2 are pulled up to near VDD through resistors R2 and R1, respectively during reads. Transistors I7, I8, and I9 are all activated during reads, pulling down the common node (com_HL), and thus enabling transistors I1 and I2 to drive current through nodes data_HL and ref_HL, respectively. Transistors I1 and I2 drive different amounts of current during reads, depending on whether the data fuse is programmed or not. If the data fuse is programmed, the current through transistor I1 will be less than the current through transistor I2, since the conductive path through the programmed data fuse will have a much higher resistance. If, on the other hand, the data fuse is not programmed, the amount of current driven by transistor I1 will be greater than that driven by transistor I2, since the resistance provided by the reference fuse is significantly larger than that of the unprogrammed data fuse. In either case, a voltage difference will develop between the data node, data_HL, and the reference node, ref_HL, and this voltage difference is indicative of whether or not the data fuse is programmed. A voltage on the data node that is greater than a voltage on the reference node indicates that the data fuse is not programmed. Conversely, a voltage on the data node that is less than the voltage on the reference node indicates that the data fuse is programmed.

The voltage differential between the data node and the reference node may be read by a comparator circuit, such as comparator 215 shown in the drawing. Such a comparator may be implemented in a fuse reading unit, such as fuse reading unit 115 shown in FIG. 1. The output of the comparator unit may be configured to provide a first logic value (e.g., a logic 1) if the fuse is programmed, and a second logic value if the fuse is (e.g., a logic 0) if the fuse is not programmed.

As previously noted, protection circuit 208 is configured to cause the formation of a temporary voltage divider within sensing circuit 204 during programming operations. If protection circuit 208 was not present, activating the transistors of programming circuit 206 will pull down the voltage present on node data_HL to VSS or near VSS. This in turn would pull down the voltage present on the gate of transistor I2, through resistor R2, to a level that is at or near VSS. Meanwhile the voltage present on the ref_HL is pulled up to VDD or near VDD. Similarly, the gate terminal of transistor I1 is also pulled up to VDD or near VDD from ref_HL through resistor R2 at the same time data_HL is pulled down to VSS or near VSS. Thus, without the presence of protection circuit 208, a gate-drain voltage difference of approximately 2 volts would exist for each of transistors I1 and I2 during the programming of the corresponding data fuse. Since transistors I1 and I2 are both rated for a maximum gate-drain voltage difference that is significantly less than 2 volts in magnitude, this difference would damage the gate oxide of these transistors and render sensing circuit 206 inoperable.

As previously noted, during fuse programming, a program_ global_H signal is asserted on the gate terminals of transistors I3 and I4 of protection circuit 208. The source terminals of transistors I3 and I4 are coupled together. The drain terminal of transistor I3 is coupled to the gate terminal of transistor I1 (and thus, also, to R2). The drain terminal of transistor I4 is coupled to the gate terminal of transistor I2 (and thus, also, to R1). Accordingly, when transistors I3 and I4 are activated, resistors R1 and R2 (which are approximately equal in value) are effectively coupled together, thus creating a temporary voltage divider.

Figure 3:
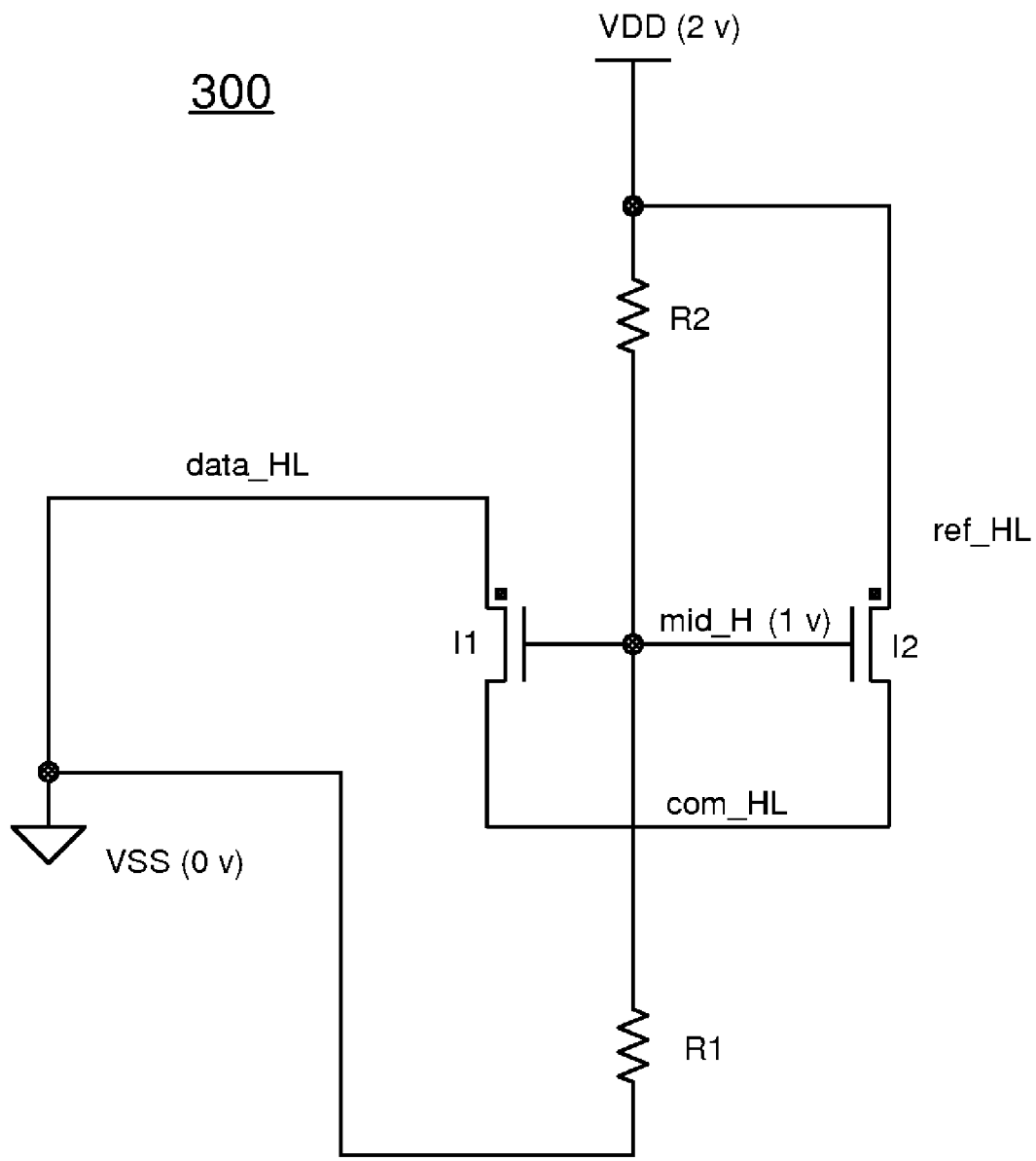
FIG. 3 is a schematic diagram of an equivalent circuit that illustrates the functioning of the protection circuit of the protection circuit while the fuse is being programmed using an exemplary voltage of 2 volts.

FIG. 3 illustrates an equivalent of the circuit that results from the activation of transistors I3 and I4. When transistors I3 and I4 are turned on, a current path exists between the node refr_H and datar_H, through node mid_H, as these three nodes effectively become a single node that couples R1 and R2. Since resistors R1 and R2 are approximately equal in value, the voltage present on node mid_H at the effective junction of the resistors and the gate terminals of I1 and I2 is approximately halfway between VDD and VSS (i.e. 'mid-rail'), or 1 volt in this example. Since data_HL is pulled down to approximately VSS (0 volts), the magnitude of the gate-drain voltage of I1 is approximately 1 volt. Furthermore, since ref_HL is pulled up to approximately VDD (2 volts), the magnitude of the gate-drain voltage of I2 is also approximately 1 volt. Thus, the gate oxides of both of transistors I1 and I2, rated for a maximum gate-drain voltage magnitude that is greater than 1 volt but less than 2 volts, are protected during programming with transistors I3 and I4 are activated. The temporary resistive voltage divider provided by protection circuit 208 remains in effect as long as transistors I3 and I4 remain turned on.

Accordingly, using the circuitry of protection circuit 208 as well as the cascode arrangement of transistors I7, I8, and I9 in read circuit 210, a fuse programming/sensing circuit can be implemented using transistors that are otherwise not capable of operating over the full range of required voltages. Protection circuit 208, when activated, will protect the gate oxides of transistors I1 and I2 from over-voltage during programming operations by creating a temporary voltage divider that includes resistors R1 and R2. This enables the use of transistors with gate oxide voltages that are smaller than the full voltage swing required by the circuit. Arranging transistors I7, I8, and I9 in a cascade arrangement in read circuit 210 enables protection of the gate oxides of each from an over-voltage condition during read operations. Arranging transistor I7 in a current mirror configuration also allows for control of the amount of current through read circuit 210.

Using the transistors of the protection circuit 208 and the cascode transistors of read circuit 210 may protect the gate oxides of various transistors within the circuit while enabling it to operate in voltage domains in which it would not be possible without using such protective means.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An electronic circuit comprising:
 a data fuse coupled to a data node;
 a reference fuse coupled to a reference node;
 a programming circuit coupled to the data node, wherein the programming circuit is configured to, when activated, cause the data fuse to be programmed;
 a sensing circuit, wherein the sensing circuit is configured to, during a read operation, draw current from the data node and the reference node in order to develop a voltage differential between the data node and the reference node;
 a read circuit configured to, when activated, enable the sensing circuit to develop the voltage differential during the read operation; and
 a protection circuit having first and second resistors, wherein the protection circuit is configured to, during programming, couple the first and second resistors in series to form a voltage divider within the sensing circuit.

2. The electronic circuit as recited in claim 1, wherein the sensing circuit includes:
 a first transistor having a drain terminal coupled to the data node; and
 a second transistor having a drain terminal coupled to the reference node.

3. The electronic circuit as recited in claim 2, wherein the the first resistor is coupled between the data node and a gate terminal of the second transistor and the second resistor is coupled between the reference node and a gate terminal of the first transistor; and wherein the protection circuit further includes:
 a third transistor having a drain terminal coupled to the gate terminal of the first transistor; and
 a fourth transistor having a drain terminal coupled to the gate terminal of the second transistor;
 wherein source terminals of each of the third and fourth transistors are coupled to each other; and
 wherein gate terminals of each of the third and fourth transistors are coupled to a global programming node.

4. The electronic circuit as recited in claim 3, wherein the programming circuit includes:
 a fifth transistor having a drain terminal coupled to the data node and a gate terminal coupled to an intermediate supply voltage node; and
 a sixth transistor having a drain terminal coupled to a source terminal of the fifth transistor, a source terminal coupled to a negative supply voltage node, and a gate terminal coupled to a local programming node.

5. The electronic circuit as recited in claim 4, wherein the data fuse is programmed by asserting a signal on the global programming node and the local programming node in order to activate the third, fourth, fifth, and sixth transistors, and the first and second resistors form the voltage divider when the third and fourth transistors are activated, wherein programming the data fuse comprises severing an electrical connection provided by the data fuse.

6. The electronic circuit as recited in claim 4, wherein the read circuit includes:
 a seventh transistor having a drain terminal coupled to a node common to source terminals of both the first and second transistors and a gate terminal coupled to a current mirror node;
 an eighth transistor having a source terminal coupled to a source terminal of the seventh transistor, and a gate terminal coupled to the intermediate supply voltage node; and
 a ninth transistor having a drain terminal coupled to a drain terminal of the eighth transistor, a gate terminal coupled to a read node, and a source terminal coupled to the negative supply voltage node.

7. The electronic circuit as recited in claim 6, wherein a read operation comprises activating the seventh, eighth, and ninth transistors, thereby causing presence of a first voltage on the data node and a second voltage on the reference node, wherein the voltage differential is the difference between the first voltage and the second voltage.

8. The electronic circuit as recited in claim 7, wherein, when the data fuse is programmed, the second voltage is greater than the first voltage, and wherein, when the data fuse is not programmed, the first voltage is greater than the second voltage.

9. The electronic circuit as recited in claim 1, wherein the data fuse is coupled between the data node and a positive supply voltage node, and wherein the reference fuse is coupled between the reference node and the positive supply voltage node.

10. A processor comprising:
   a fuse reader unit configured to, upon processor startup, read information to determine a processor operation configuration; and
   a plurality of fuse circuits coupled to provide the information to the fuse reader unit, wherein each of the plurality of electronic circuits includes:
   a data fuse coupled to a data node;
   a reference fuse coupled to a reference node;
   a programming circuit coupled to the data node, wherein the programming circuit is configured to, when activated, cause the data fuse to be programmed;
   a sensing circuit, wherein the sensing circuit is configured to, during a read operation, draw current from the data node and the reference node in order to develop a voltage differential between the data node and the reference node;
   a read circuit configured to, when activated, enable the sensing circuit to develop the voltage differential during the read operation; and
   a protection circuit having first and second resistors, wherein the protection circuit is configured to, during programming, couple the first and second resistors in series to form a voltage divider within the sensing circuit.

11. The processor as recited in claim 10, wherein the sensing circuit includes:
   a first transistor having a drain terminal coupled to the data node; and
   a second transistor having a drain terminal coupled to the reference node.

12. The processor as recited in claim 11, wherein the the first resistor is coupled between the data node and a gate terminal of the second transistor and the second resistor is coupled between the reference node and a gate terminal of the first transistor; and wherein the protection circuit further includes:
   a third transistor having a drain terminal coupled to the gate terminal of the first transistor; and
   a fourth transistor coupled to the gate terminal of the second transistor;
   wherein source terminals of each of the third and fourth transistors are coupled to each other; and
   wherein gate terminals of each of the third and fourth transistors are coupled to a global programming node.

13. The processor as recited in claim 12, wherein the programming circuit includes:
   a fifth transistor having a drain terminal coupled to the data node and a gate terminal coupled to an intermediate supply voltage node; and
   a sixth transistor having a drain terminal coupled to a source terminal of the fifth transistor, a source terminal coupled to a negative supply voltage node, and a gate terminal coupled to a local programming node.

14. The processor as recited in claim 13, wherein the data fuse is programmed by asserting a signal on the global programming node and the local programming node in order to activate the third, fourth, fifth and sixth transistors, and wherein the first and second resistors form the voltage divider when the third and fourth transistors are activated, and wherein programming the data fuse comprises severing an electrical connection provided by the data fuse.

15. The processor as recited in claim 13, wherein the read circuit includes:
   a seventh transistor having a drain terminal coupled to a node common to source terminals of both the first and second transistors and a gate terminal coupled to a current mirror node;
   an eighth transistor having a drain terminal coupled to a source terminal of the seventh transistor, and a gate terminal coupled to the intermediate supply voltage node; and
   a ninth transistor having a drain terminal coupled to a source terminal of the eighth transistor, a gate terminal coupled to a read node, and a source terminal coupled to the negative supply voltage node.

16. The processor as recited in claim 15, wherein a read operation comprises activating the seventh, eighth, and ninth transistors, thereby causing presence of a first voltage on the data node and a second voltage on the reference node, wherein the voltage differential is the difference between the first voltage and the second voltage.

17. The processor as recited in claim 16, wherein, when the data fuse is programmed, the second voltage is greater than the first voltage, and wherein, when the data fuse is not programmed, the first voltage is greater than the second voltage.

18. The processor as recited in claim 17, wherein the data fuse is coupled between the data node and a positive supply voltage node, and wherein the reference fuse is coupled between the reference node and the positive supply voltage node.

19. The electronic circuit as recited in claim 1, wherein the protection circuit is configured to be inactive during the read operation.

20. The processor as recited in claim 10, wherein the protection circuit is configured to be inactive during the read operation.

* * * * *